United States Patent
Oh et al.

(10) Patent No.: US 7,944,047 B2
(45) Date of Patent: May 17, 2011

(54) METHOD AND STRUCTURE OF EXPANDING, UPGRADING, OR FIXING MULTI-CHIP PACKAGE

(75) Inventors: Jong Hoon Oh, Chapel Hill, NC (US); Klaus Hummler, Apex, NC (US); Oliver Kiehl, Charlotte, VT (US); Josef Schnell, Charlotte, VT (US); Wayne Frederick Ellis, Jericho, VT (US); Jung Pill Kim, Cary, NC (US); Lee Ward Collins, Cary, NC (US); Octavian Beldiman, South Burlington, VT (US)

(73) Assignee: Qimonda AG, Munich (DE)

( * ) Notice: Subject to any disclaimer, the term of this patent is extended or adjusted under 35 U.S.C. 154(b) by 653 days.

(21) Appl. No.: 11/860,985

(22) Filed: Sep. 25, 2007

(65) Prior Publication Data
US 2009/0079055 A1    Mar. 26, 2009

(51) Int. Cl.
*H01L 21/00* (2006.01)
*H01L 23/34* (2006.01)
(52) U.S. Cl. . 257/723; 257/686; 257/777; 257/E23.169; 438/4; 438/6; 438/12

(58) Field of Classification Search .............. 257/723, 257/686, E23.169; 438/4, 6, 10–12, 599–601, 438/107, 109
See application file for complete search history.

(56) References Cited

U.S. PATENT DOCUMENTS

| | | | |
|---|---|---|---|
| 6,392,950 B2 * | 5/2002 | Ayukawa et al. | 365/230.03 |
| 6,539,497 B2 * | 3/2003 | Swoboda et al. | 714/30 |
| 6,928,512 B2 * | 8/2005 | Ayukawa et al. | 711/105 |
| 7,423,458 B2 * | 9/2008 | Aghtar | 327/91 |
| 2002/0199056 A1 * | 12/2002 | Ayukawa et al. | 711/106 |
| 2005/0151777 A1 * | 7/2005 | Silverbrook | 347/19 |
| 2006/0059387 A1 * | 3/2006 | Swoboda et al. | 714/30 |
| 2006/0197753 A1 * | 9/2006 | Hotelling | 345/173 |
| 2007/0266447 A1 * | 11/2007 | Hollander | 726/34 |
| 2008/0285244 A1 * | 11/2008 | Knickerbocker | 361/760 |

* cited by examiner

*Primary Examiner* — Nitin Parekh
(74) *Attorney, Agent, or Firm* — Patterson & Sheridan, LLP

(57) ABSTRACT

Embodiments of the present invention generally provide techniques and apparatus for altering the functionality of a multi-chip package (MCP) without requiring entire replacement of the MCP. The MCP may be designed with a top package substrate designed to interface with an add-on package that, when sensed by the MCP, alters the functionality of the MCP.

20 Claims, 7 Drawing Sheets

METHOD AND STRUCTURE OF EXPANDING, UPGRADING, OR FIXING MULTI-CHIP PACKAGE

BACKGROUND OF THE INVENTION

Description of the Related Art

Multi-chip packages (MCPs) are individual semiconductor packages, made of plastic or ceramic, containing two or more die connected internally with wire-bonding. MCPs allow multiple devices to be integrated into a single, more compact, package with the same footprint on a printed circuit board (PCB) as a single chip device. MCPs typically contact the PCB with pins, such as solder balls or other type of conductive elements.

SUMMARY OF THE INVENTION

One embodiment provides a multi-chip package and an add-on package, where the add-on package is attached to the multi-chip package. The multi-chip package generally includes a plurality of dies, a top and bottom substrate package, and circuitry that can detect the presence of a device attached to the top package substrate. Once the add-on package is attached, the add-on package can automatically notify the MCP that an expansion, upgrade or replacement of functionality is in effect, thus allowing the MCP to accommodate the add-on package.

One embodiment provides a system generally including a multi-chip package (MCP) and an add-on package. The MCP having a plurality of dies, a bottom package substrate for interfacing with a printed circuit board (PCB), and a top package substrate serving as an interface between the MCP and an add-on package. The add-on package attached to the top package substrate of the multi-chip package to alter functionality of the multi-chip package.

One embodiment provides a multi-chip package (MCP). The MCP generally includes a plurality of dies, a bottom package substrate for interfacing with a printed circuit board (PCB), a top package substrate serving as an interface between the MCP and an add-on package, and a sensing circuit for detecting the presence of an add-on package attached to the top package substrate of the multi-chip package to alter functionality of the multi-chip package.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 illustrates the MCP of FIG. 1 with an add-on package added on.

DETAILED DESCRIPTION OF THE PREFERRED EMBODIMENT

Embodiments of the invention generally provide techniques that allow expanding (e.g., new logic or memory), upgrading (e.g., increasing density of memory), or fixing (e.g., replacing a failed chip) a multi-chip package (MCP) by attaching an add-on package.

Figure 1:
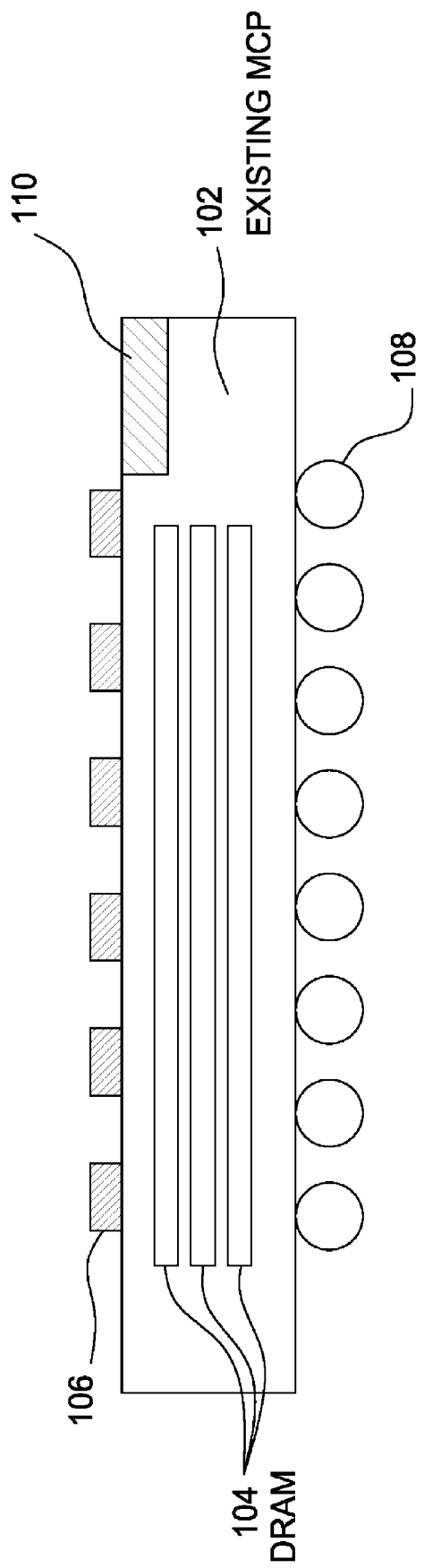
FIG. 1 illustrates one embodiment of a multi-chip package (MCP) designed to accept an add-on package in accordance with one embodiment of the present invention.

FIG. 1 is a block diagram illustrating an embodiment of a multi-chip package 102 (MCP) including a plurality of dies 104, top and bottom package substrates 106, 108. Detection circuitry 110 responds to the presence of a device attached to the top package substrate 106 and may alter the MCP functionality, as will be described in greater detail below.

Each die 104 in the MCP 102 can be one of a variety of different functional type devices, including memory devices and/or processors. Each memory device can be a DRAM, FLASH, or any other volatile or non-volatile memory. Additionally, the memory devices do not have to be of the same type. Furthermore, in one embodiment, one or more of the dies 104 can be reserved for additional or extended functionality that can be utilized with the attachment of an add-on package to the top package substrate 106 of the MCP 102. For another embodiment, the add-on package can also be employed to upgrade or repair the MCP 102. The add-on package may be attached to the MCP 102 by a variety of different methods, including soldering, socketing, and the like.

Figure 2:
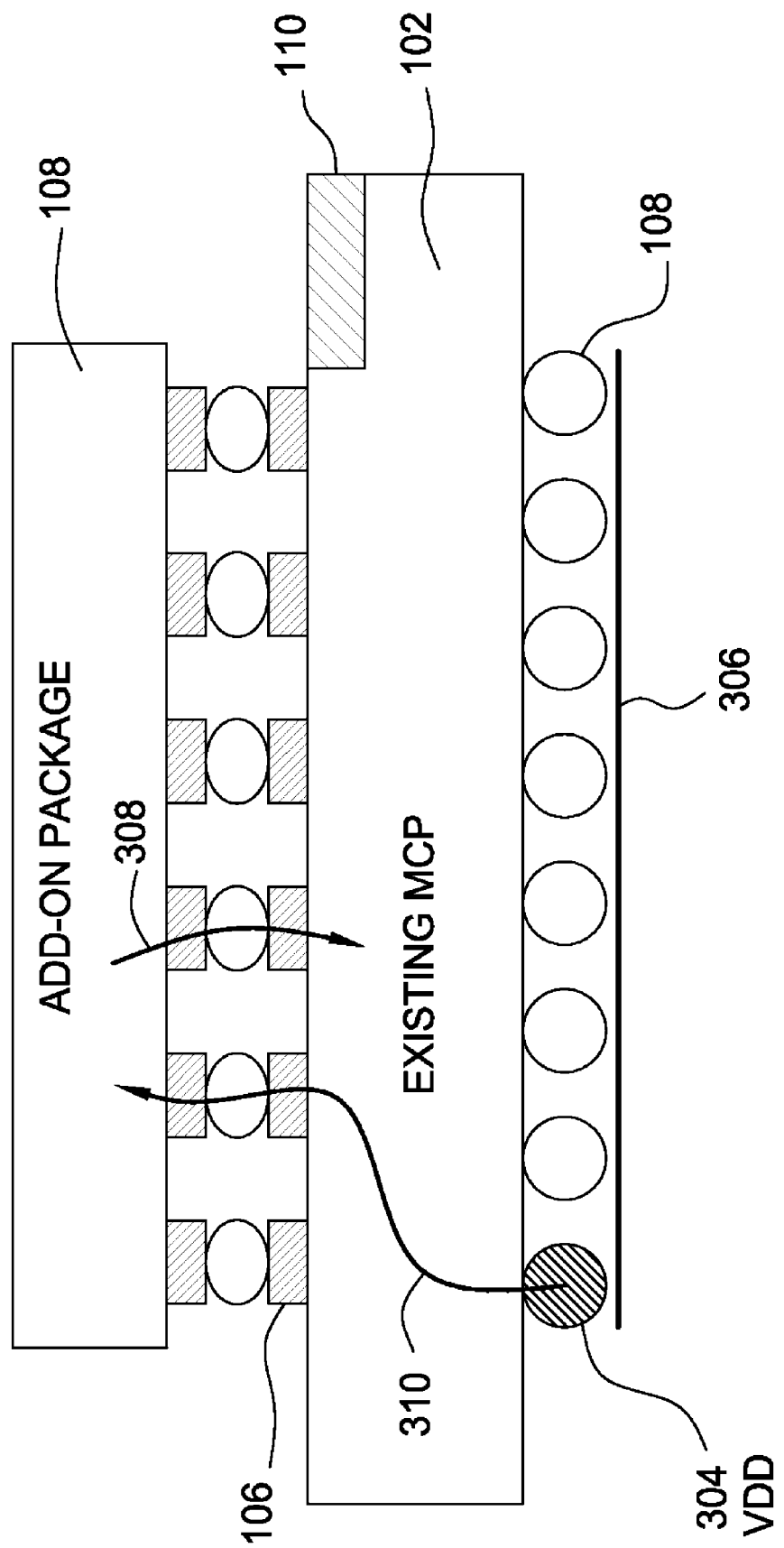

FIG. 2 illustrates the MCP of FIG. 1 with an add-on package 108 added on to modify the MCP functionality in some way. A variety of different examples of modified functionality (expansion, upgrading, and repair) are discussed in FIGS. 3-5 below.

Regardless of the type of functional modification, the modification may be activated via a sense-on-presence method, as illustrated in FIG. 2. Upon attachment of the add-on package 108 to the MCP 102, the add-on package 108 can detect power via a power (VDD) pin 304. The VDD pin 304 is connected to a PCB 306 via the bottom package substrate 108 of the MCP 102. Power is passed through 310 the MCP 102 and connected to the add-on package 108 via the top package substrate 106 of the MCP 102.

Once power is detected, the add-on package 108 can automatically send a control signal 308 to the MCP 102, via the top package substrate 106, indicating that an expansion, upgrade or replacement of functionality is in effect. The detection circuitry 110 located on the MCP 102 may respond to the control signal 308, driven by the add-on package 108, allowing the MCP 102 to accommodate the add-on package 108. Alternatively, in another embodiment, the detection circuitry 110 can respond to a control signal driven by a pin connected to the bottom package substrate 108 of the MCP 102, similar to the method described above in reference to the VDD pin 302.

Depending on the particular embodiment, the add-on package may simply provide an indication to change functionality of the MCP (e.g., generating signals when present). As an alternative, or in addition, the add-on package may also include a variety of different type devices to alter (or enhance) functionality of the MCP. For example, the add-on device may increase memory capacity of the MCP, by including a memory device that is the same or different than memory devices of the MCP. For example, if the MCP has DRAM die, the add-on device may expand the memory capacity (within the same footprint) with one or more additional DRAM die. As another example, the add-on package may add a different type of memory, for example, providing non-volatile storage to complement volatile storage of the MCP.

Figure 3:
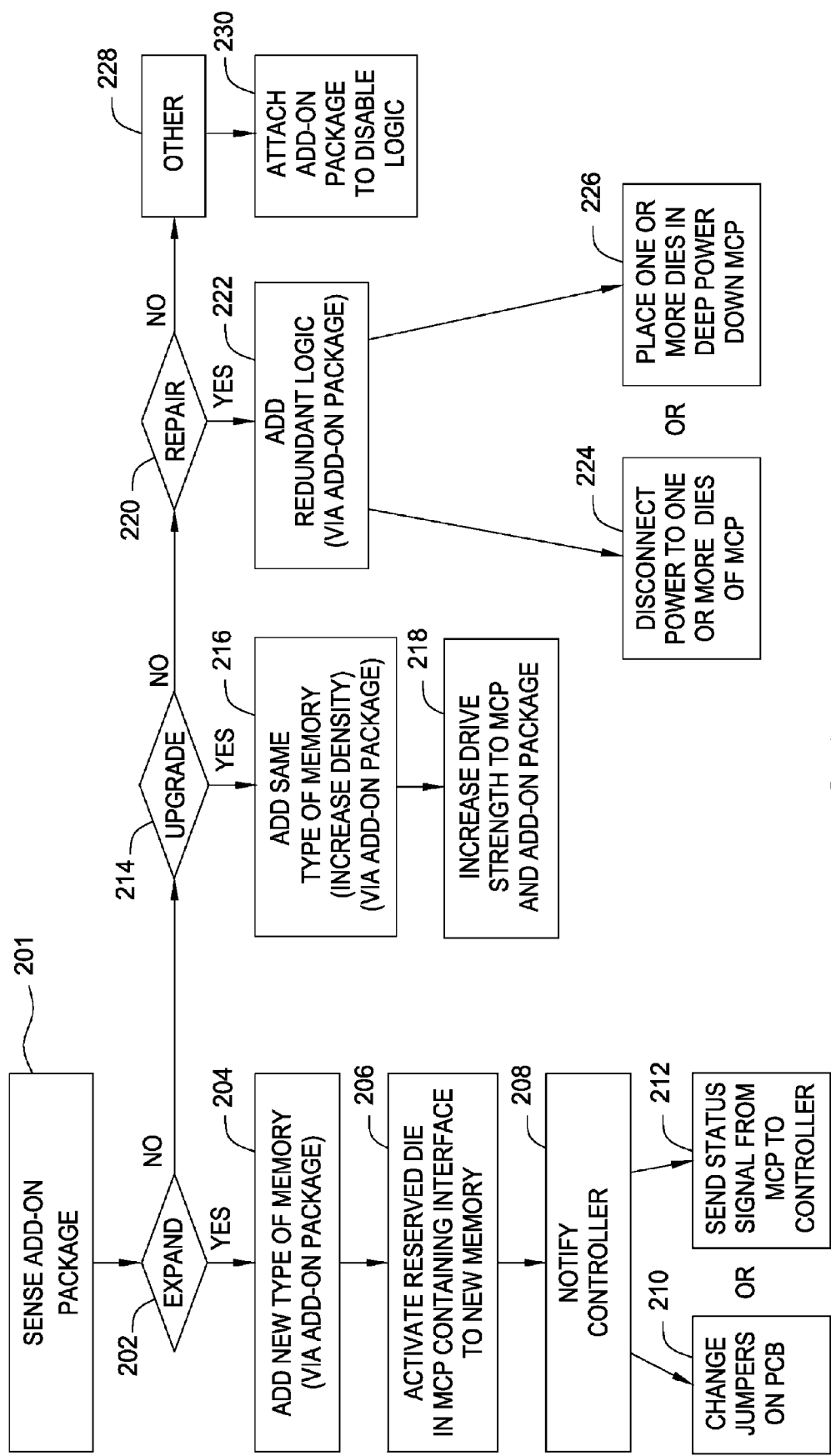
FIG. 3 is a flow chart of example operations for modifying operation of an MCP via an add-on package in accordance with embodiments of the present invention.

FIG. 3 illustrates how MCP functionality may be modified in a variety of different ways when an add-on package is attached to a MCP. The operations can be activated via a sense-on-presence, as discussed above with reference to FIG. 2.

One operation allows an add-on package to be used to expand functionality (202) of the MCP. One example can be adding and supporting a new type of memory (204) previously not associated with the MCP. For example, in one embodiment, the MCP may comprise of a plurality of DRAM and a reserved die with an interface to another type of memory. The reserved die may remain unused until an add-on package, containing memory compatible with the memory interface on the reserved die, is attached to the MCP.

Once the add-on package is attached, the memory located on the add-on package can be utilized by activating the reserved die in the MCP that contains the memory interface (206). After the add-on package is attached and the interface is activated, a controller which communicates with the MCP can then be notified of the added functionality (208). For one embodiment, the controller can be notified by changing jumper settings on a printed circuit board (210). For another embodiment, the controller can be notified via a status signal sent by the MCP (212).

Another operation allows the add-on package to be used to upgrade the functionality in the MCP (214). One example can be adding more density to the already existing memory located in the MCP (216). For example, if the MCP contains a plurality of DRAM, additional DRAM can be added via the add-on package. The additional DRAM on the add-on package can be accessed via additional address and chip select pins connected between the MCP and the add-on-package via the top package substrate. A potential side effect of adding the additional package, however, may result in a heavier bus load. Therefore, the drive strength to the MCP and the add-on package may need to be increased (218).

Yet another operation allows the add-on package to be used to replace/repair functionality on the MCP (220). For example, the add-on package may contain redundant logic that is identical to some or all of the logic on the MCP (222) or may be used to activate redundant logic located on the MCP. Therefore, in the event that the MCP, or one or more dies on the MCP, is no longer functional, the redundant logic on the add-on package may be attached to the MCP and can be used as a substitute (or the add-on logic may activate redundant logic in the MCP).

In one embodiment, this functionality may be achieved by simply disconnecting the power to the entire MCP (224), or to one or more dies in the MCP, depending on the level of failure. Alternatively, in another embodiment, the MCP can be placed in a deep power down mode (226), where select circuitry inside the MCP is disabled, thus minimizing power consumption, yet still allowing recovery of the MCP if needed.

Other operations (228) may include simply disabling failing logic via attachment of an add-on package (230), for example, without replacing it with redundant logic. Other operations may also include various other aspects of the MCP, such as re-mapping memory segments to different address space or changing one or more other types of operating parameters.

Figure 4A:
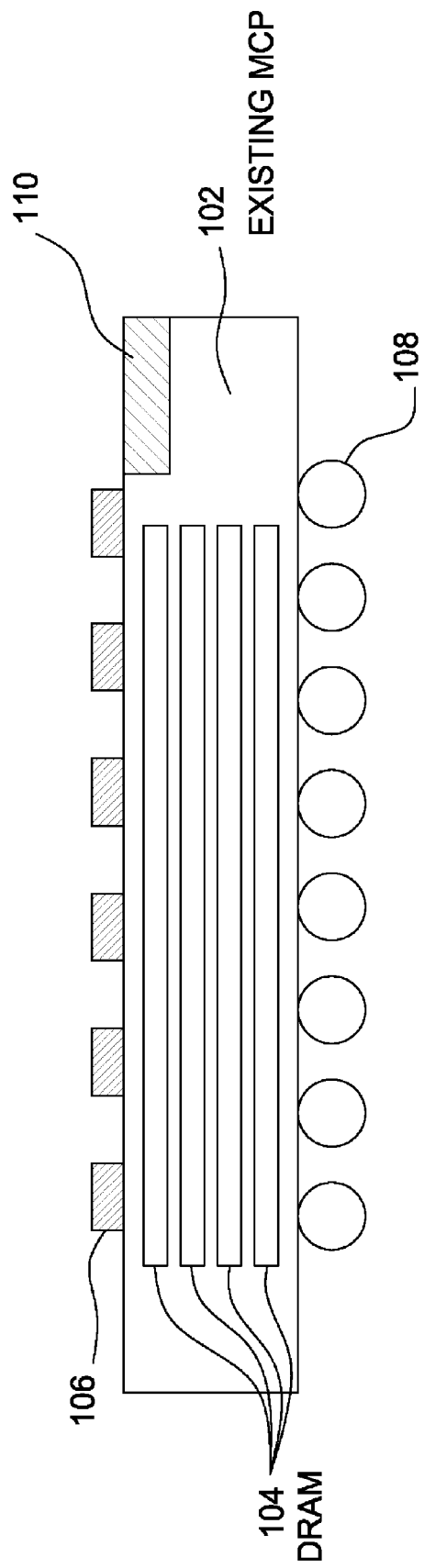
FIGS. 4A and 4B illustrate upgrading an MCP via an add-on package.
Figure 4B:
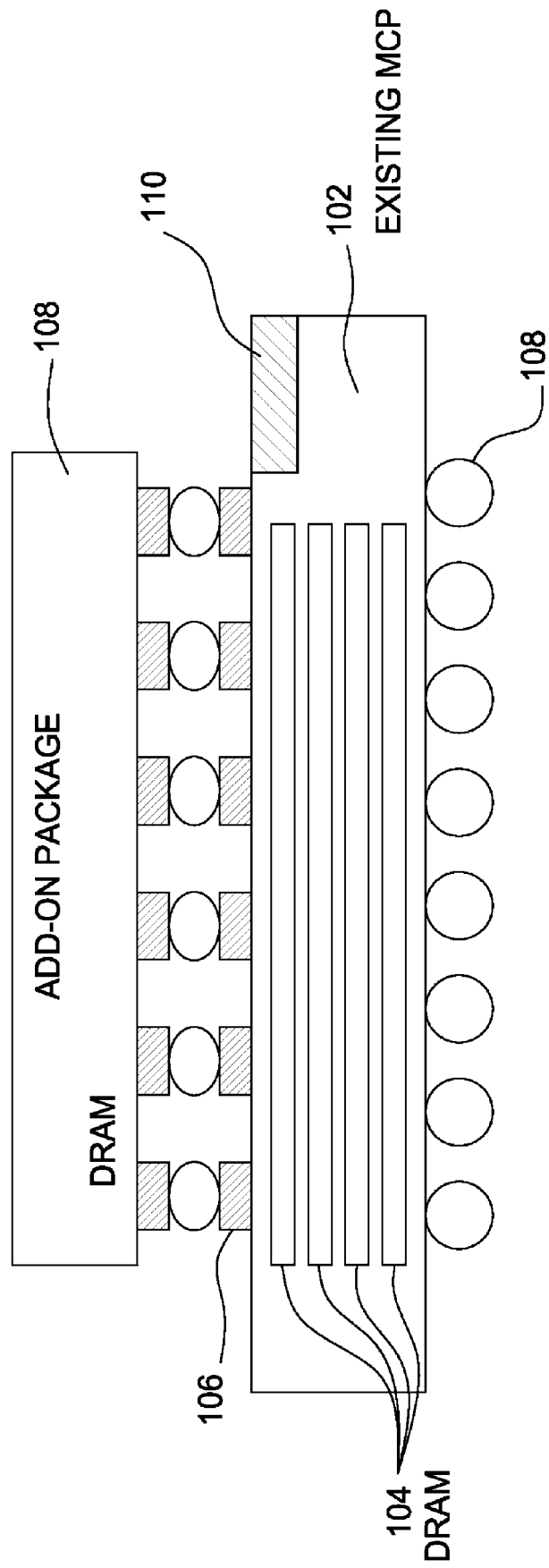

FIGS. 4A and 4B illustrate upgrading the functionality of an MPC via an add-on package. Specifically, FIG. 4A illustrates an MCP 102 employing a plurality of DRAM 104, and a top and bottom package substrate 106, 108. Without an add-on package attached to the MCP 102, the amount of DRAM accessible by a controller is limited to the amount of DRAM 104 located on the MCP 102. However, as illustrated in FIG. 4B, an add-on package 108, containing more DRAM, can be connected to the MCP 102 via the top package substrate 106, thus allowing a controller access to more DRAM. As stated earlier, the additional DRAM on the add-on package can be accessed via additional address and chip select pins connected between the MCP and the add-on-package via the top package substrate.

Figure 5A:
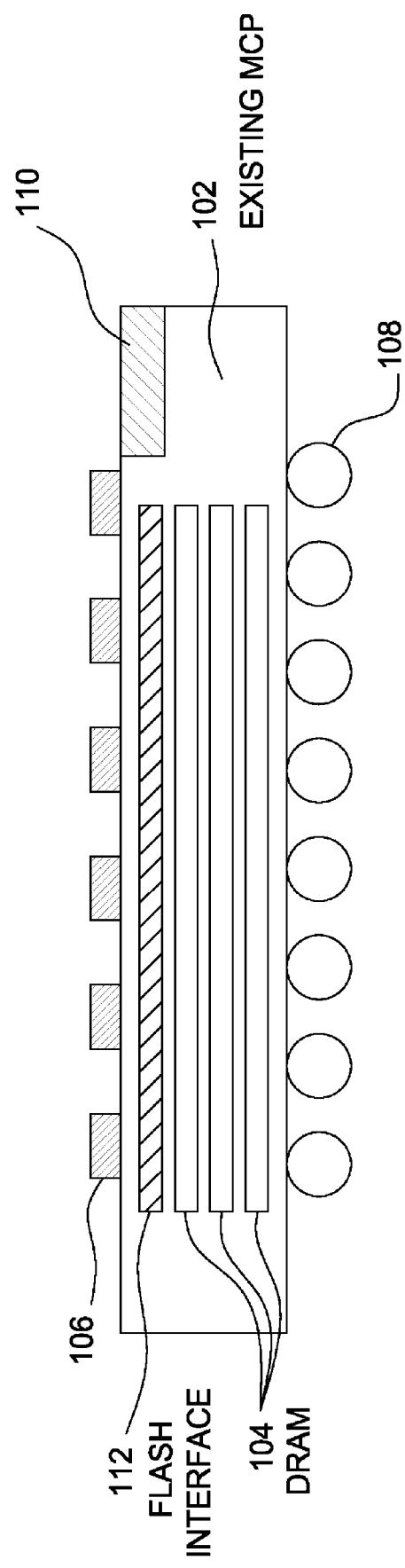
FIGS. 5A and 5B illustrate expanding an MCP via an add-on package.
Figure 5B:
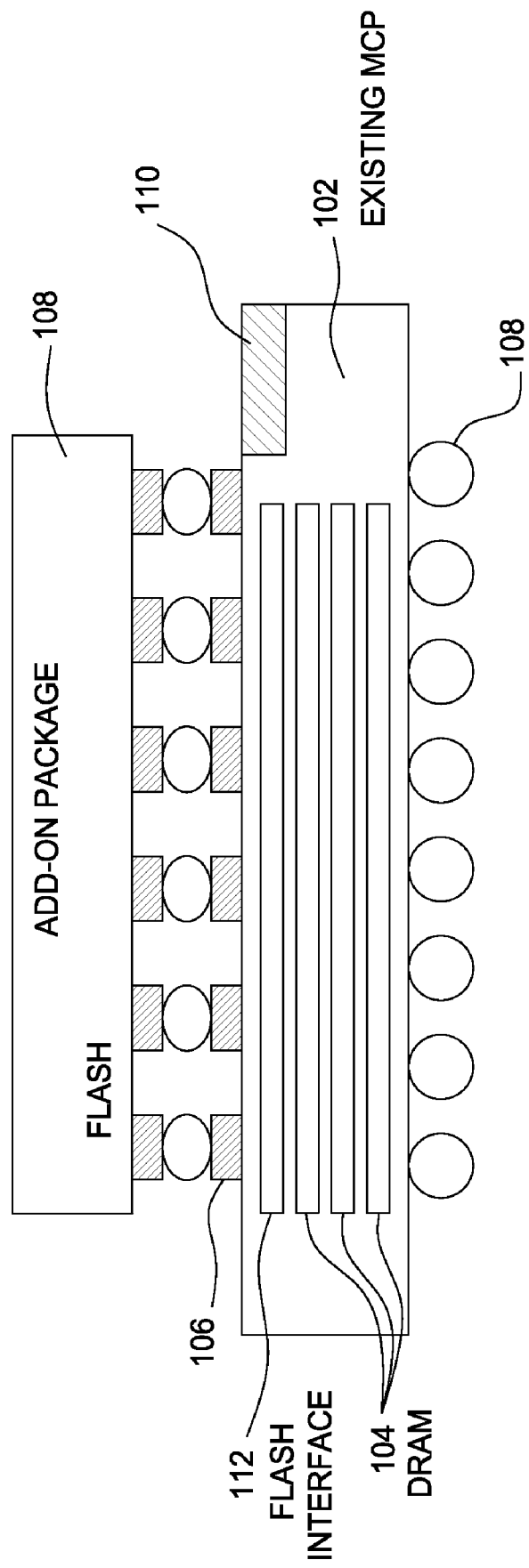

FIGS. 5A and 5B illustrate expanding the functionality of an MCP 102 when an add-on package is attached. Specifically, FIG. 5A illustrates an MCP 102 employing a plurality of DRAM 104, a top and bottom package substrate, 106, 108 and a reserved die 112 that contains a FLASH Interface. Without an add-on package attached to the MCP 102, the reserved die 112 remains inactive.

However, as illustrated in FIG. 5B, upon attachment of an add-on package 108 containing FLASH memory, the reserved die 112 in the MCP 102 is activated and ready to communicate with the add-on package 108. In another embodiment, the MCP can contain the plurality of DRAM and the FLASH memory, where the FLASH memory is located on the reserved die and is activated and addressable upon attachment of the add-on-package 108.

While the foregoing is directed to embodiments of the present invention, other and further embodiments of the invention may be devised without departing from the basic scope thereof, and the scope thereof is determined by the claims that follow.

What is claimed is:

1. A system, comprising:
  a multi-chip package (MCP) having a plurality of dies, a bottom package substrate for interfacing with a printed circuit board (PCB), and a top package substrate serving as an interface between the MCP and an add-on package, wherein the plurality of dies are stacked between the bottom and top substrates along an axis perpendicular to the bottom and top package substrates; and
  the add-on package attached to the multi-chip package to alter functionality of the multi-chip package, wherein the add-on package is located above the top package substrate on the axis.

2. The system of claim 1, wherein the multi-chip package contains a die that is reserved for new functionality, and is activated upon attachment of the add-on package.

3. The system of claim 1, wherein the add-on package comprises at least one DRAM memory device such that the combination of the add-on package and the MCP has a greater memory capacity than the MCP alone.

4. The system of claim 1, wherein the plurality of dies of the multi-chip package comprises at least one non-volatile memory device.

5. The system of claim 1, wherein the plurality of dies of the multi-chip package comprises at least one of (i) at least one volatile memory device and at least one non-volatile memory device and (ii) at least one processor and at least one memory device.

6. The system of claim 1, wherein the add-on package is attached to the top package substrate of the multi-chip package.

7. The system of claim 1, wherein at least two dies are configured to operate in the absence of the add-on package.

8. A multi-chip package (MCP), comprising:
  a bottom package substrate for interfacing with a printed circuit board (PCB);

a top package substrate serving as an interface between the MCP and an add-on package;

a plurality of dies, the dies stacked between the bottom and top substrates along an axis perpendicular to the bottom and top package substrates; and a sensing circuit for detecting the presence of the add-on package attached to the multi-chip package to alter functionality of the multi-chip package, wherein the add-on package is located above the top package substrate on the axis.

9. The MCP of claim 8, wherein the plurality of dies comprises at least one die that is reserved for new functionality and is activated upon attachment of the add-on package.

10. The MCP of claim 9, wherein the die reserved for new functionality comprises a memory interface.

11. The MCP of claim 10, wherein:

the plurality of dies of the MCP comprise of a plurality of dynamic random access (DRAM) memory devices; and the memory interface comprises a memory interface for a non-volatile memory device in the add-on package.

12. The MCP of claim 8, wherein the plurality of dies of the multi-chip package comprises at least one volatile memory device and at least one non-volatile memory device.

13. The MCP of claim 8, wherein the plurality of dies of the multi-chip package comprises at least one processor and at least one memory device.

14. A method, comprising:

sensing, by a multi-chip package (MCP), the attachment of an add-on package to a top package substrate of the MCP, wherein the add-on package is located above the top package substrate on an axis perpendicular to the top package substrate; and altering functionality of the MCP in response to sensing the attachment of the add-on package.

15. The method of claim 14, wherein altering functionality of the MCP comprises disabling one or more dies of the MCP.

16. The method of claim 15, wherein altering functionality of the MCP further comprises enabling functionality of a device on the add-on package to replace the functionality of the one or more dies of the MCP disabled.

17. The method of claim 15, wherein disabling the one or more dies comprises placing the one or more dies in a deep power down mode state.

18. The method of claim 14, further comprising:

communicating to a controller to inform new functionality is available.

19. The method of claim 18, wherein communicating to the controller is accomplished by asserting a status signal from the add-on package to the controller.

20. A method, comprising:

sensing the attachment of an add-on package to a top package substrate of a multi-chip package (MCP);

communicating to a controller to inform new functionality is available, wherein communicating to the controller is accomplished by changing jumper settings on a PCB; and altering functionality of the MCP in response to sensing the attachment of the add-on package.

\* \* \* \* \*